US011199573B2

(12) United States Patent  
Park et al.

(10) Patent No.: US 11,199,573 B2  
(45) Date of Patent: Dec. 14, 2021

(54) DISPLAY PANEL AND DISPLAY DEVICE

(71) Applicant: Samsung Display Co., Ltd., Yongin-si (KR)

(72) Inventors: Jun Hyun Park, Suwon-si (KR); Dong Woo Kim, Yongin-si (KR); An Su Lee, Seoul (KR); Kang Moon Jo, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 71 days.

(21) Appl. No.: 16/851,590

(22) Filed: Apr. 17, 2020

(65) Prior Publication Data

US 2020/0333391 A1 Oct. 22, 2020

(30) Foreign Application Priority Data

Apr. 17, 2019 (KR) .................. 10-2019-0044843

(51) Int. Cl.
*G01R 31/28* (2006.01)
*G01R 31/56* (2020.01)
*G09G 3/00* (2006.01)
*G09G 3/3266* (2016.01)

(52) U.S. Cl.
CPC ......... *G01R 31/2825* (2013.01); *G01R 31/56* (2020.01); *G09G 3/006* (2013.01); *G09G 3/3266* (2013.01); *G09G 2300/0413* (2013.01); *G09G 2310/0286* (2013.01); *G09G 2330/12* (2013.01)

(58) Field of Classification Search
CPC .... G01R 31/2825; G01R 31/56; G01R 31/52; G09G 3/3266; G09G 3/006; G09G 2330/12; G09G 2310/0286; G09G 2300/0413; G09G 3/3225; G09G 3/20; G09G 2310/0267; G09G 3/3208
USPC ..................................... 324/750.01
See application file for complete search history.

(56) References Cited

U.S. PATENT DOCUMENTS

| 6,028,442 A * | 2/2000 | Lee .................. G09G 3/006 324/760.02 |
| 2006/0001622 A1* | 1/2006 | Kim .................. G09G 3/3275 345/76 |
| 2009/0219547 A1* | 9/2009 | Kauhanen .............. G01D 5/30 356/615 |

(Continued)

FOREIGN PATENT DOCUMENTS

| JP | 2017-173505 A | 9/2017 |
| KR | 10-2017-0001629 A | 1/2017 |

(Continued)

*Primary Examiner* — Tung X Nguyen
*Assistant Examiner* — Robert P Alejnikov, Jr.
(74) *Attorney, Agent, or Firm* — Lewis Roca Rothgerber Christie LLP

(57) ABSTRACT

A display panel includes: a pixel region comprising a plurality of pixels; an open/short test region comprising a plurality of open/short test pads; a dummy stage configured to generate a carry signal in response to a scan start signal; and a plurality of stages configured to sequentially provide a plurality of scan signals to the plurality of pixels in response to the carry signal, wherein the plurality of stages is spaced apart by a first distance from the pixel region, and the dummy stage is spaced apart by a second distance greater than the first distance from the open/short test region.

16 Claims, 9 Drawing Sheets

(56) References Cited

U.S. PATENT DOCUMENTS

| | | | | |
|---|---|---|---|---|
| 2015/0084666 | A1* | 3/2015 | Kim | G09G 3/006 324/762.03 |
| 2016/0379586 | A1* | 12/2016 | Wu | G09G 3/20 345/174 |
| 2018/0075803 | A1* | 3/2018 | Lee | G09G 3/3233 |
| 2018/0090042 | A1* | 3/2018 | Lin | G09G 3/006 |
| 2019/0310509 | A1* | 10/2019 | Shin | H01L 27/1255 |

FOREIGN PATENT DOCUMENTS

| | | |
|---|---|---|
| KR | 10-2018-0074637 A | 7/2018 |
| KR | 10-2018-0074905 A | 7/2018 |

* cited by examiner

DISPLAY PANEL AND DISPLAY DEVICE

CROSS-REFERENCE TO RELATED APPLICATION(S)

The present application claims priority to and the benefit of Korean Patent Applications No. 10-2019-0044843, filed on Apr. 17, 2019 in the Korean Intellectual Property Office (KIPO), the entire disclosure of which is incorporated herein by reference in its entirety.

BACKGROUND

1. Field

Aspects of some example embodiments relate generally to a display device.

2. Description of the Related Art

When a display panel, such as an organic light emitting diode (OLED) display panel, is manufactured, an open/short test may be performed to detect whether or not wirings, such as data lines, formed in the display panel are defective. Open/short test equipment may perform an open/short test by applying an open/short test signal to an open/short test pad of the display panel and by receiving the open/short test signal via a probe.

However, because the probe of the open/short test equipment may contact the display panel, the display panel may be damaged by the probe of the open/short test equipment.

The above information disclosed in this Background section is only for enhancement of understanding of the background and therefore the information discussed in this Background section does not necessarily constitute prior art.

SUMMARY

Aspects of some example embodiments relate generally to a display device, and for example, to a display panel including an open/short test region and a display device including the display panel.

Aspects of some example embodiments include a display panel capable of preventing or reducing damage during an open/short test.

Aspects of some example embodiments include a display device capable of preventing or reducing damage during an open/short test.

According to some example embodiments, a display panel includes a pixel region in which a plurality of pixels is formed, an open/short test region in which a plurality of open/short test pads is formed, a dummy stage configured to generate a carry signal in response to a scan start signal, and a plurality of stages configured to sequentially provide a plurality of scan signals to the plurality of pixels in response to the carry signal. The plurality of stages is spaced apart by a first distance from the pixel region, and the dummy stage is spaced apart by a second distance greater than the first distance from the open/short test region.

According to some example embodiments, the second distance between the open/short test region and the dummy stage may be greater than or equal to a reference distance for preventing damage caused by an open/short test equipment.

According to some example embodiments, a width of the dummy stage may be narrower than a width of each of the plurality of stages.

According to some example embodiments, each of the plurality of stages may include a first circuit portion configured to operate in response to a previous carry signal, and a first buffer portion controlled by the first circuit portion to output a corresponding scan signal of the plurality of scan signals. The dummy stage may include a second circuit portion configured to operate in response to the scan start signal, and a second buffer portion controlled by the second circuit portion. A width of the second buffer portion of the dummy stage may be narrower than a width of the first buffer portion of each of the plurality of stages.

According to some example embodiments, a size of at least one transistor included in the second buffer portion may be smaller than a size of at least one transistor included in the first buffer portion.

According to some example embodiments, each of the first circuit portion and the second circuit portion may include a control node charging block configured to charge an internal control node in response to the scan start signal or the previous carry signal, an inverter block configured to control an internal inverted control node based on a voltage of the internal control node, a control node holding block configured to hold the voltage of the internal control node, a carry block configured to generate a current carry signal in response to the voltage of the internal control node, and a control node discharging block configured to discharge the internal control node in response to a next carry signal. Each of the first buffer portion and the second buffer portion may include a scan signal outputting block configured to generate the corresponding scan signal in response to the voltage of the internal control node. A size of the scan signal outputting block of the second buffer portion may be smaller than a size of the scan signal outputting block of the first buffer portion.

According to some example embodiments, the scan signal outputting block of the first buffer portion may be coupled to a corresponding scan line, and outputs the corresponding scan signal to the corresponding scan line, and the scan signal outputting block of the second buffer portion may not be coupled to a scan line.

According to some example embodiments, each of the first circuit portion and the second circuit portion further may include a sensing block configured to control the internal control node based on a sensing on signal and a sensing clock signal. Each of the first buffer portion and the second buffer portion may further include a sensing signal outputting block configured to generate a corresponding sensing signal of a plurality of sensing signals in response to the voltage of the internal control node. A size of the sensing signal outputting block of the second buffer portion may be smaller than a size of the sensing signal outputting block of the first buffer portion.

According to some example embodiments, the sensing signal outputting block of the first buffer portion may be coupled to a corresponding sensing control line, and outputs the corresponding sensing signal to the corresponding sensing control line, and the sensing signal outputting block of the second buffer portion may not be coupled to a sensing control line.

According to some example embodiments, each of the plurality of stages may include a first circuit portion configured to operate in response to a previous carry signal, and a first buffer portion controlled by the first circuit portion to output a corresponding scan signal of the plurality of scan signals and a corresponding sensing signal of a plurality of sensing signals. The dummy stage may include a second circuit portion configured to operate in response to the scan start signal, and a second buffer portion controlled by the second circuit portion. A width of the second circuit portion of the dummy stage may be narrower than a width of the first circuit portion of each of the plurality of stages, and a width of the second buffer portion of the dummy stage may be narrower than a width of the first buffer portion of each of the plurality of stages.

According to some example embodiments, the first circuit portion may include a sensing block configured to control an internal control node based on a sensing on signal and a sensing clock signal, and the second circuit portion may not include the sensing block.

According to some example embodiments, a size of at least one transistor included in the second buffer portion may be smaller than a size of at least one transistor included in the first buffer portion.

According to some example embodiments, the first buffer portion may include a sensing signal outputting block configured to generate the corresponding sensing signal in response to a voltage of an internal control node of the first circuit portion, and the second circuit portion may not include the sensing signal outputting block.

According to some example embodiments, the display panel may further include a wiring formed on the dummy stage and the plurality of stages. The wiring may be spaced apart by a third distance from the pixel region, and may be spaced apart by a fourth distance greater than the third distance from the open/short test region.

According to some example embodiments, the wiring may include a first portion passing through the dummy stage and extending in a vertical direction, a second portion extending in a horizontal direction between the dummy stage and the plurality of stages, and a third portion passing through the plurality of stages and extending in the vertical direction.

According to some example embodiments, there is provided a display panel including a pixel region in which a plurality of pixels is formed, an open/short test region in which a plurality of open/short test pads is formed, a dummy stage configured to generate a carry signal in response to a scan start signal, and a plurality of stages configured to sequentially provide a plurality of scan signals to the plurality of pixels in response to the carry signal. The dummy stage is spaced apart from an open/short test line which a probe of an open/short test equipment moves along.

According to some example embodiments, the open/short test line may extend in a horizontal direction, and the dummy stage may be spaced apart by a distance along a vertical direction from the open/short test line.

According to some example embodiments, the dummy stage may be formed outside an outer edge of the open/short test region.

According to some example embodiments, a width of the dummy stage may be narrower than a width of each of the plurality of stages.

According to some example embodiments, there is provided a display device including a display panel including a pixel region in which a plurality of pixels is formed, an open/short test region in which a plurality of open/short test pads is formed, a dummy stage configured to generate a carry signal in response to a scan start signal, and a plurality of stages configured to sequentially provide a plurality of scan signals to the plurality of pixels in response to the carry signal, a data driver configured to output data signals to the display panel, and a controller configured to control the data driver, the dummy stage and the plurality of stages. The plurality of stages is spaced apart by a first distance from the pixel region, and the dummy stage is spaced apart by a second distance greater than the first distance from the open/short test region.

As described above, in a display panel and a display device according to some example embodiments, a plurality of stages may be spaced apart by a first distance from a pixel region, and a dummy stage may be spaced apart by a second distance greater than the first distance from an open/short test region. Accordingly, damage to the display panel that may otherwise occur during an open/short test may be prevented or reduced.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Figure 1:
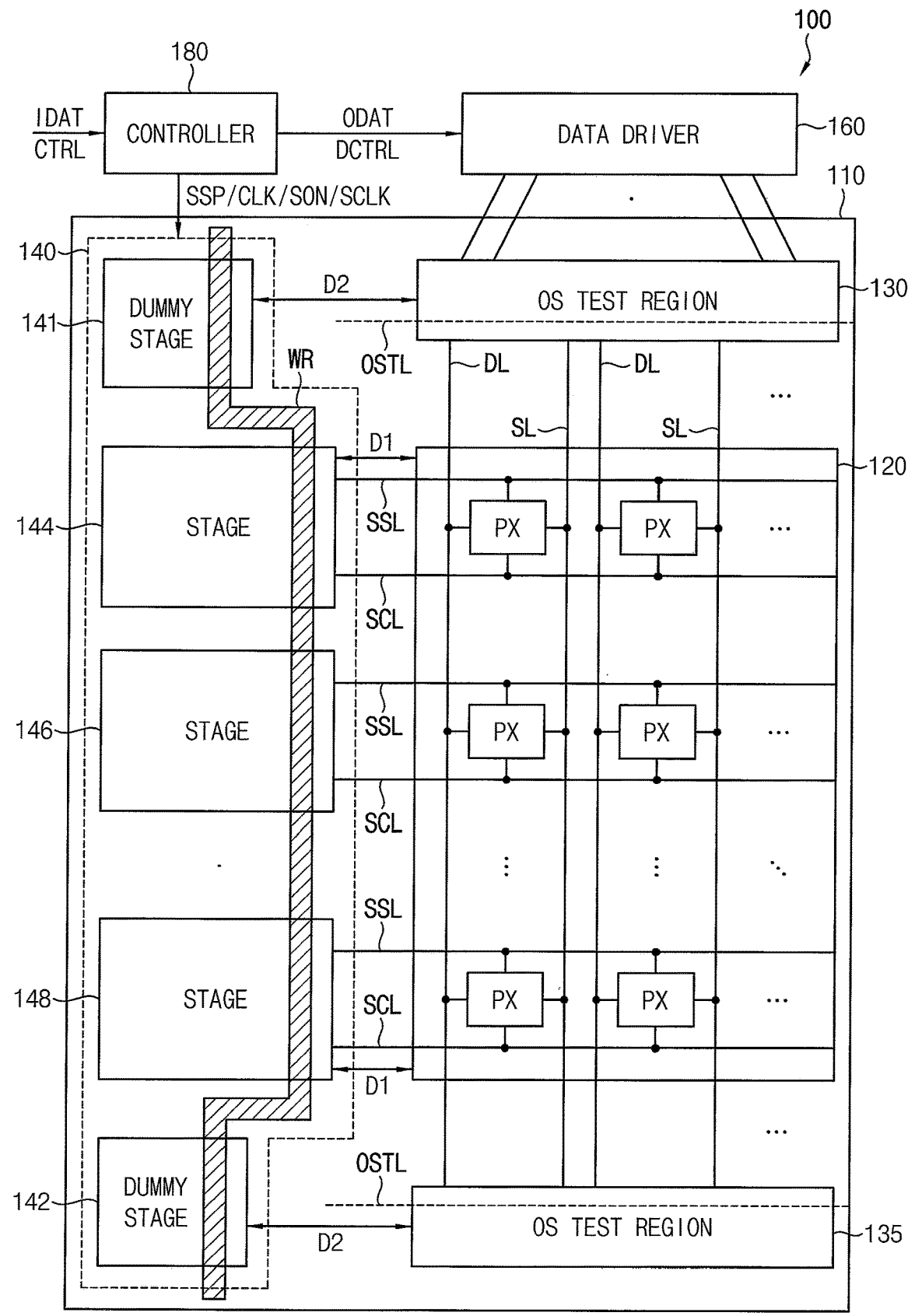
FIG. 1 is a diagram illustrating a display device according to some example embodiments.

The example embodiments are described more fully hereinafter with reference to the accompanying drawings. Like or similar reference numerals refer to like or similar elements throughout.

Figure 2:
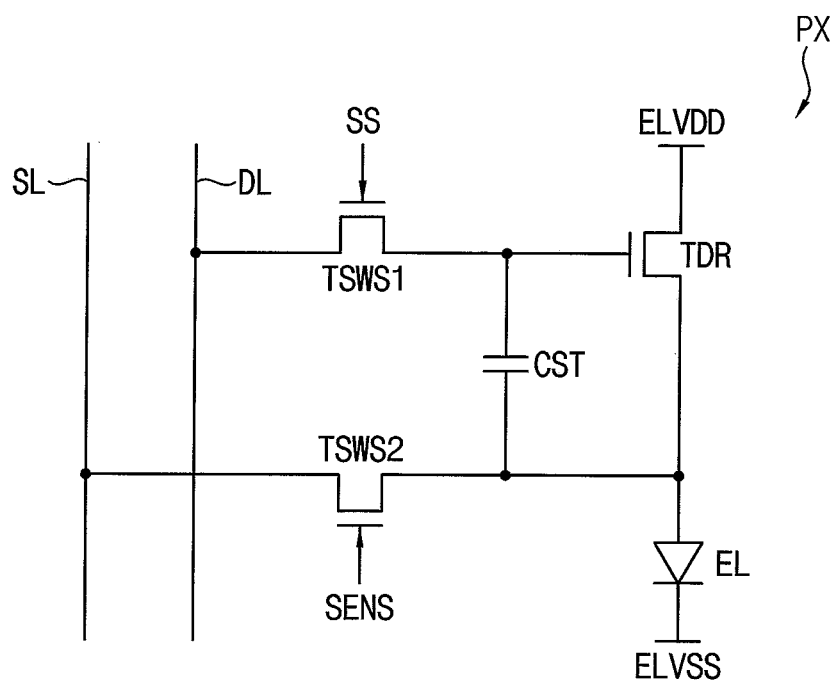
FIG. 2 is a circuit diagram illustrating an example of a pixel included in a display device of FIG. 1.

FIG. 1 is a diagram illustrating a display device according to some example embodiments, and FIG. 2 is a circuit diagram illustrating an example of a pixel included in a display device of FIG. 1.

Referring to FIG. 1, a display device 100 according to some example embodiments may include a display panel 110, a data driver 160 that outputs data signals to the display panel 110, and a controller 180 that controls an operation of the display device 100. According to some example embodiments, the display panel 110 may include a pixel region 120 in which a plurality of pixels PX is arranged, an open/short test region 130 and 135 in which a plurality of open/short test pads is formed, and a scan driver 140 that provides a plurality of scan signals and/or a plurality of sensing signals to the plurality of pixels PX.

In the pixel region 120 of the display panel 110, a plurality of data lines DL, a plurality of scan lines SSL, and the plurality of pixels PX may be formed. The plurality of pixels PX may be coupled to the plurality of data lines DL and the plurality of scan lines SSL. According to some example embodiments, in the pixel region 120, a plurality of sensing control lines SCL and a plurality of sensing lines SL may be further formed, and the plurality of pixels PX may be further coupled to the plurality of sensing control lines SCL and the plurality of sensing lines SL.

According to some example embodiments, the display panel 110 may be an organic light emitting diode (OLED) display panel where each pixel PX includes an organic light emitting diode. According to some example embodiments, the display panel 110 may be, but is not limited to, a quantum dot (QD)-OLED display panel where a light emitting layer of each pixel PX includes a QD material. According to some example embodiments, the display panel 110 may be a liquid crystal display (LCD) panel, or any other suitable display panel.

According to some example embodiments, as illustrated in FIG. 2, each pixel PX may have a 3T1C structure including three transistors TSWS1, TSWS2 and TDR and one capacitor CST. For example, each pixel PX may include a storage capacitor CST, a first switching transistor TSWS1 that couples a data line DL to one electrode of the storage capacitor CST in response to a scan signal SS (e.g., applied to a gate electrode of the first switching transistor TSWS1), a second switching transistor TSWS2 that couples a sensing line SL to the other electrode of the storage capacitor CST in response to a sensing signal SENS (e.g., applied to a gate electrode of the second switching transistor TSWS2), a driving transistor TDR that generates a driving current based on a voltage stored in the storage capacitor CST (e.g., a difference between a voltage applied to the data line DL and the sensing line SL), and an organic light emitting diode EL that emits light based on the driving current.

Although FIG. 2 illustrates an example of the pixel PX having the 3T1C structure, the pixel PX of the display device 100 according to some example embodiments is not limited to the 3T1C structure. For example, the pixel PX may have another 3T1C structure having a connection relationship different from that of the 3T1C structure of FIG. 2, or may have any structure including two or more transistors and one or more capacitors. Additionally, according to some example embodiments, there may be additional transistors, capacitors, and other electrical components included within the circuit structure of the pixel circuit, without departing from the spirit and scope of embodiments according to the present disclosure.

In the open/short test region 130 and 135 of the display panel 110, the plurality of open/short test pads to which an open/short test equipment applies open/short test signals may be formed. The open/short test equipment may receive the open/short test signals that have moved through the plurality of open/short test pads and lines (e.g., the data lines DL and/or the sensing lines SL) of the pixel region 120 of the display panel 110 by using a probe of the open/short test equipment, and may detect an open/short defect of the lines of the pixel region 120 based on the received open/short test signals. To receive the open/short test signals, the probe of the open/short test equipment may move through the open/short test region 130 and 135 such that the probe may contact the respective data lines DL and/or the respective sensing lines SL. Here, a virtual line which the probe of open/short test equipment is moved along may be referred to as an open/short test line OSTL. In some example embodiments, as illustrated in FIG. 1, two open/short test regions 130 and 135 may be formed or located at both (e.g., opposite or opposing) sides (e.g., an upper side and a lower side) of the pixel region 120, respectively. In other example embodiments, one open/short test region 130 or 135 may be formed at one side (e.g., the upper side or the lower side) of the pixel region 120.

The scan driver 140 may be formed on the display panel 110, and may sequentially provide the plurality of scan signals to the plurality of pixels PX through the plurality of scan lines SSL in response to a scan control signal received from the controller 180. In some example embodiments, the scan control signal may include, but is not limited to including, a scan start signal SSP and a scan clock signal CLK. The scan driver 140 may include at least one dummy stage 141 and 142 that generates a carry signal based on the scan start signal SSP and the scan clock signal CLK, and a plurality of stages 144, 146, ... , 148 that sequentially provides the plurality of scan signals to the plurality of pixels PX based on the carry signal and the scan clock signal CLK. In some example embodiments, the scan driver 140 may further receive, as the scan control signal, a sensing on signal SON and a sensing clock signal SCLK, and may provide the plurality of sensing signals to the plurality of pixels PX through plurality of sensing control lines SCL in response to the sensing on signal SON and the sensing clock signal SCLK.

In the display device 100 according to some example embodiments, the plurality of stages 144, 146, ... , 148 may be spaced apart by a first distance D1 from the pixel region 120, and the dummy stage 141 and 142 may be spaced apart by a second distance D2 greater than the first distance D1 from the open/short test region 130 and 135. In some example embodiments, the second distance D2 between the open/short test region 130 and 135 and the dummy stage 141 and 142 may be greater than or equal to a reference distance for preventing or reducing damage caused by the open/short test equipment. For example, in a conventional display device, a wiring of the display panel 110, e.g., a wiring WR passing through the dummy stage 141 and 142 may be damaged by the probe of the open/short test equipment contacting the display panel 110.

However, in the display device 100 according to some example embodiments, the dummy stage 141 and 142 may be spaced apart by the second distance D2 that is greater than the reference distance from the open/short test region 130 and 135, thereby preventing or reducing the damage caused by the probe of the open/short test equipment. For example, the reference distance may be, but not limited to, about 500 μm, and the second distance D2 may be greater than about 500 μm.

In some example embodiments, so that the plurality of stages 144, 146, ... , 148 may be spaced apart by the first distance D1 from the pixel region 120, and the dummy stage 141 and 142 may be spaced apart by the second distance D2 from the open/short test region 130 and 135, a width (e.g., a horizontal width) of the dummy stage 141 and 142 is narrower than a width of each of the plurality of stages 144, 146, ... , 148. As illustrated in FIG. 1, each of the plurality of stages 144, 146, ... , 148 may be coupled to a corresponding scan line SSL, and the dummy stage 141 and 142 may not be coupled to the scan line SSL. The dummy stage 141 and 142 may not output the scan signal to the scan line SSL, and thus a size of at least one transistor for generating the scan signal in the dummy stage 141 and 142 may be smaller than a size of at least one transistor for generating the scan signal in each of the plurality of stages 144, 146, ... , 148. Accordingly, because the at least one transistor of the dummy stage 141 and 142 has a small size, the dummy stage 141 and 142 may have the width smaller than that of each of the plurality of stages 144, 146, ... , 148.

Further, in some example embodiments, the plurality of stages 144, 146, . . . , 148 may be further coupled to a corresponding sensing control line SCL, and the dummy stage 141 and 142 may not be coupled to the sensing control line SCL.

In some example embodiments, the display device 100 may further include the wiring WR formed on the dummy stage 141 and 142 and the plurality of stages 144, 146, . . . , 148. The wiring WR may be any wiring for providing a voltage or a signal. For example, the wiring WR may be, but is not limited to, a wiring for a low power supply voltage, a wiring for a high power supply voltage, a wiring for a low gate voltage VGL, a wiring for a high gate voltage VGH, or the like.

In the display device 100 according to some example embodiments, as illustrated in FIG. 1, the wiring WR may be spaced apart by a third distance from the pixel region 120 while the wiring WR passes through the plurality of stages 144, 146, . . . , 148, and may be spaced apart by a fourth distance greater than the third distance from the open/short test region 130 and 135 while the wiring WR passes through the dummy stage 141 and 142 (or the area of the dummy stages 141 and 142). For example, the wiring WR may include a first portion passing through the dummy stage 141 and 142 and extending in a vertical direction (e.g., a direction of the data line DL), a second portion extending in a horizontal direction (e.g., a direction of the scan line SSL) between the dummy stage 141 and 142 and the plurality of stages 144, 146, . . . , 148, and a third portion passing through the plurality of stages 144, 146, . . . , 148 and extending in the vertical direction. In this case, the third portion of the wiring WR may be spaced apart by the third distance from the pixel region 120, and the first portion of the wiring WR may be spaced apart by the fourth distance greater than the third distance from the open/short test region 130 and 135. Accordingly, the wiring WR may be spaced apart, by a greater distance, from the open/short test line OSTL that is the virtual line which the probe of open/short test equipment moves along, thereby preventing or reducing instances of damage to the wiring WR that may otherwise be caused during the open/short test.

In some example embodiments, as illustrated in FIG. 1, the scan driver 140 may include at least one first dummy stage 141 that is located previous to a first stage 144 of the plurality of stages 144, 146, . . . , 148, and at least one second dummy stage 142 that is located next to a last stage 148 of the plurality of stages 144, 146, . . . , 148. Further, each of the first dummy stage 141 and the second dummy stage 142 may be one or more dummy stages. In other example embodiments, the scan driver 140 may include the first dummy stage 141, and may not include the second dummy stage 142. In still other example embodiments, the scan driver 140 may include the second dummy stage 142, and may not include the first dummy stage 141.

The data driver 160 may output the data signals to the plurality of data lines DL based on a data control signal DCTRL and output image data ODAT received from the controller 180. In some example embodiments, the data control signal DCTRL may include, but not limited to, a horizontal start signal and a load signal. Further, in some example embodiments, the display device 100 may further include a sensing driver that senses driving characteristics of the plurality of pixels PX, for example threshold voltages of the driving transistors TDR of the plurality of pixels PX through the plurality of sensing lines SL. According to some example embodiments, the sensing driver may be included in the data driver 160, or may be formed outside the data driver 160.

The controller 180 (e.g., a timing controller (TCON)) may control the data driver 160 and the scan driver 140 (i.e., the dummy stage 141 and 142 and the plurality of stages 144, 146, . . . , 148) based on input image data IDAT and a control signal CTRL received from an external host (e.g., a graphic processing unit (GPU) or a graphic card). In some example embodiments, the input image data IDAT may be RGB image data including red image data, green image data and blue image data.

Further, in some example embodiments, the control signal CTRL may include, but is not limited to including, a vertical synchronization signal, a horizontal synchronization signal, a data enable signal, a master clock signal, etc. The controller may control an operation of the data driver 160 by providing the data control signal DCTRL and the output image data ODAT to the data driver 160, and may control an operation of the scan driver 140 by providing the scan control signal (e.g., the scan start signal SSP, the scan clock signal CLK, the sensing on signal SON and the sensing clock signal SCLK) to the scan driver 140.

As described above, in the display device 100 according to some example embodiments, the plurality of stages 144, 146, . . . , 148 may be spaced apart by the first distance D1 from the pixel region 120, and the dummy stage 141 and 142 may be spaced apart by the second distance D2 greater than the first distance D1 from the open/short test region 130 and 135. Further, the second distance D2 between the open/short test region 130 and 135 and the dummy stage 141 and 142 may be greater than or equal to the reference distance for preventing the damage caused by the open/short test equipment. Accordingly, in the display device 100 according to some example embodiments, damage to the display panel 110 that may otherwise be caused during the open/short test may be prevented or reduced.

Figure 3:
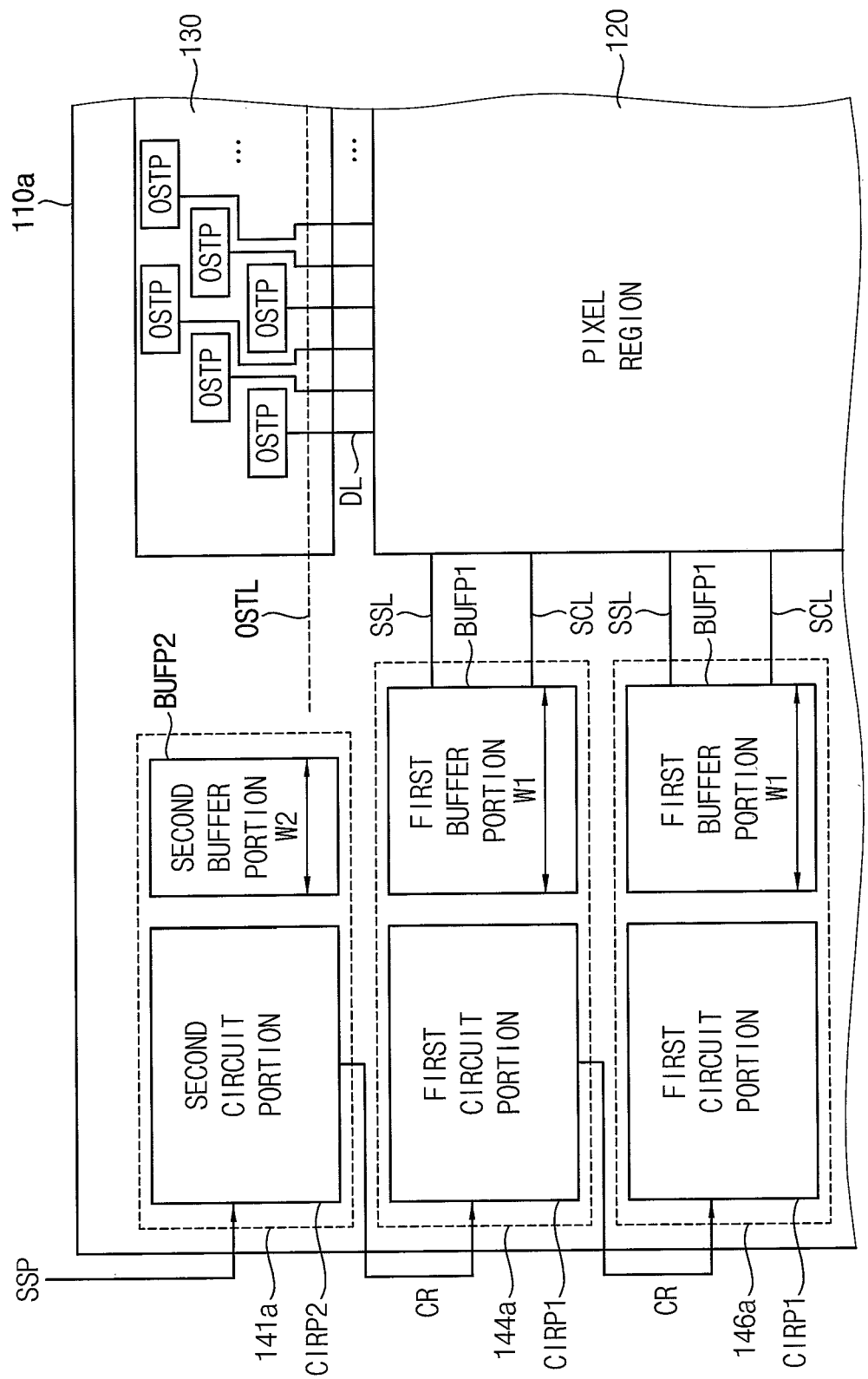
FIG. 3 is a diagram illustrating a portion of a display panel according to some example embodiments.
Figure 4:
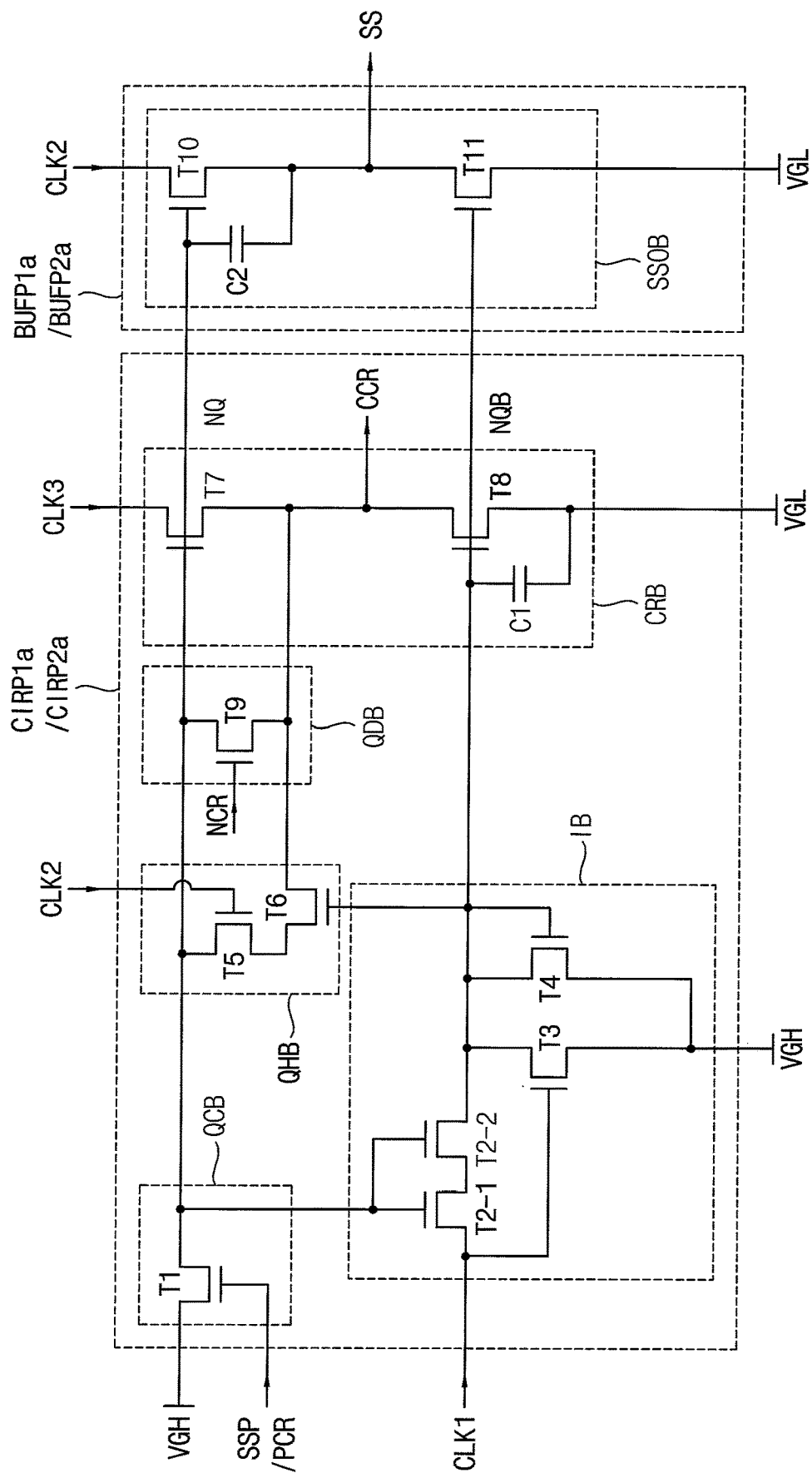
FIG. 4 is a circuit diagram illustrating an example of a dummy stage or a normal stage included in a display panel of FIG. 3.
Figure 5:
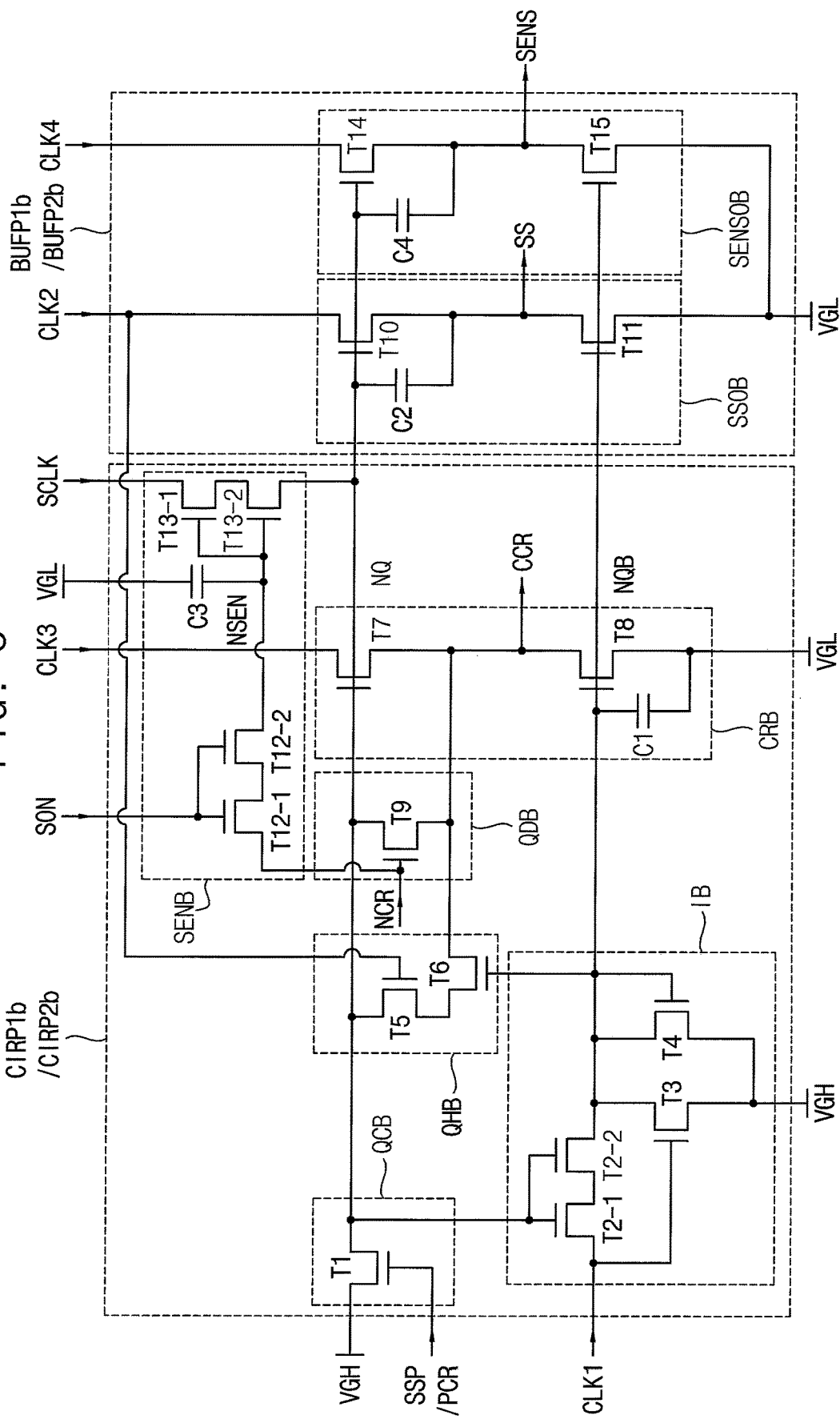
FIG. 5 is a circuit diagram illustrating another example of a dummy stage or a normal stage included in a display panel of FIG. 3.

FIG. 3 is a diagram illustrating a portion of a display panel according to some example embodiments, FIG. 4 is a circuit diagram illustrating an example of a dummy stage or a normal stage included in a display panel of FIG. 3, and FIG. 5 is a circuit diagram illustrating another example of a dummy stage or a normal stage included in a display panel of FIG. 3.

Referring to FIG. 3, a display panel 110*a* according to some example embodiments may include a pixel region 120 in which a plurality of pixels is formed, an open/short test region 130 in which a plurality of open/short test pads OSTP is formed, at least one dummy stage 141*a* that generates a carry signal CR in response to a scan start signal SSP, and a plurality of stages 144*a* and 146*a* (or normal stages 144*a* and 146*a*) that sequentially provides a plurality of scan signals to the plurality of pixels in response to the carry signal CR.

In the display panel 110*a*, the plurality of stages 144*a* and 146*a* may be spaced apart by a first distance from the pixel region 120, and the dummy stage 141*a* may be spaced apart by a second distance greater than the first distance from the open/short test region 130. In some example embodiments, the second distance between the open/short test region 130 and the dummy stage 141*a* may be greater than or equal to a reference distance for preventing or reducing damage caused by an open/short test equipment. So that the plurality of stages 144*a* and 146*a* may be spaced apart by the first distance from the pixel region 120, and the dummy stage 141*a* may be spaced apart by the second distance from the open/short test region 130, as illustrated in FIG. 3, a width (e.g., a horizontal width) of the dummy stage 141a may be narrower than a width of each of the plurality of stages 144a and 146a.

Each of the plurality of stages 144a and 146a may include a first circuit portion CIRP1 that operates in response to a previous carry signal (e.g., the carry signal CR generated by the dummy stage 141a with respect to a first stage 144a, or the carry signal CR generated by the first stage 144a with respect to a second stage 146a), and a first buffer portion BUFP1 controlled by the first circuit portion CIRP1 to output a corresponding scan signal. The dummy stage 141a may include a second circuit portion CIRP2 that operates in response to the scan start signal SSP, and a second buffer portion BUFP2 controlled by the second circuit portion CIRP2. In the display panel 110a according to some example embodiments, so that the dummy stage 141a may have the width narrower than that of each of the plurality of stages 144a and 146a, a width W2 of the second buffer portion BUFP2 of the dummy stage 141a may be narrower than a width W1 of the first buffer portion BUFP1 of each of the plurality of stages 144a and 146a. For example, so that the second buffer portion BUFP2 may have the width W2 narrower than the width W1 of the first buffer portion BUFP1, the second buffer portion BUFP2 may be implemented to include at least one transistor having a size smaller than a size of at least one transistor included in the first buffer portion BUFP1.

In some example embodiments, as illustrated in FIG. 4, each of the first circuit portion CIRP1a of each stage 144a and 146a and the second circuit portion CIRP2 of the dummy stage 141a may include a control node charging block QCB that charges an internal control node NQ in response to the scan start signal SSP or the previous carry signal PCR, an inverter block IB that controls an internal inverted control node NQB based on a voltage of the internal control node NQ, a control node holding block QHB that holds the voltage of the internal control node NQ, a carry block CRB that generates a current carry signal CCR in response to the voltage of the internal control node NQ, and a control node discharging block QDB that discharges the internal control node NQ in response to a next carry signal NCR. Further, each of the first buffer portion BUFP1a of each stage 144a and 146a and the second buffer portion BUFP2a of the dummy stage 141a may include a scan signal outputting block SSOB that generates the corresponding scan signal SS in response to the voltage of the internal control node NQ.

For example, the control node charging block QCB may include a first transistor T1 that transfers a high gate voltage VGH to the internal control node NQ in response to the scan start signal SSP or the previous carry signal PCR. The inverter block IB may include a second transistor T2-1 and T2-2 that transfers a first scan clock signal CLK1 to the internal inverted control node NQB in response to the voltage of the internal control node NQ, a third transistor T3 that transfers the high gate voltage VGH to the internal inverted control node NQB in response to the first scan clock signal CLK1, and a fourth transistor T4 that transfers the high gate voltage VGH to the internal inverted control node NQB in response to a voltage of the internal inverted control node NQB.

According to some example embodiments, as illustrated in FIG. 4, the second transistor T2-1 and T2-2 may be implemented with two transistors T2-1 and T2-2 that are connected in series. The control node holding block QHB may include fifth and sixth transistors T5 and T6 that couple the internal control node NQ to a carry output node in response to a second scan clock signal CLK2 and the voltage of the internal control node NQ. The carry block CRB may include a seventh transistor T7 that outputs a third scan clock signal CLK3 as the current carry signal CCR in response to the voltage of the internal control node NQ, an eighth transistor T8 that transfers a low gate voltage VGL to the carry output node in response to the voltage of the internal inverted control node NQB, and a first capacitor C1 coupled between the internal inverted control node NQB and a line of the low gate voltage VGL.

The control node discharging block QDB may include a ninth transistor T9 that couples the internal control node NQ to the carry output node in response to the next carry signal NCR. Further, the scan signal outputting block SSOB may include a tenth transistor T10 that outputs the second scan clock signal CLK2 as the scan signal SS in response to the voltage of the internal control node NQ, an eleventh transistor T11 that transfers the low gate voltage VGL to a scan output node in response to the voltage of the internal inverted control node NQB, and a second capacitor C2 coupled between the internal control node NQ and the scan output node.

In the display panel 110a according to some example embodiments, a size of the scan signal outputting block SSOB of the second buffer portion BUFP2a may be smaller than a size of the scan signal outputting block SSOB of the first buffer portion BUFP1a. To achieve the smaller size of the scan signal outputting block SSOB of the second buffer portion BUFP2a, the tenth and eleventh transistors T10 and T11 of the scan signal outputting block SSOB of the second buffer portion BUFP2a may have a size (e.g., a channel width) smaller than that of the tenth and eleventh transistors T10 and T11 of the scan signal outputting block SSOB of the first buffer portion BUFP1a.

Further, as illustrated in FIG. 3, the scan signal outputting block SSOB of the first buffer portion BUFP1 and BUFP1a may be coupled to a corresponding scan line SSL, and may output the corresponding scan signal SS to the corresponding scan line SSL. However, the scan signal outputting block SSOB of the second buffer portion BUFP2 and BUFP2a may not be coupled to a scan line.

Accordingly, although the scan signal outputting block SSOB of the second buffer portion BUFP2 and BUFP2a includes the tenth and eleventh transistors T10 and T11 having the small size, the dummy stage 141a including the second buffer portion BUFP2 and BUFP2a may operate normally. As described above, the second buffer portion BUFP2 and BUFP2a may have the width W2 narrower than the width W1 of the first buffer portion BUFP1 and BUFP1a, and thus damage to the display panel 110a that may otherwise occur during an open/short test may be prevented or reduced.

According to some example embodiments, as illustrated in FIG. 5, compared with the first circuit portion CIRP1a or the second circuit portion CIRP2a illustrated in FIG. 4, each of the first circuit portion CIRP1b of each stage 144a and 146a and the second circuit portion CIRP2b of the dummy stage 141a may further include a sensing block SENB that controls the internal control node NQ based on a sensing on signal SON and a sensing clock signal SCLK. Further, compared with the first buffer portion BUFP1a or the second buffer portion BUFP2a illustrated in FIG. 4, each of the first buffer portion BUFP1b of each stage 144a and 146a and the second buffer portion BUFP2b of the dummy stage 141a may further include a sensing signal outputting block SEN-SOB that generates a corresponding sensing signal SENS in response to the voltage of the internal control node NQ.

For example, the sensing block SENB may include a twelfth transistor T12-1 and T12-2 that transfer the next carry signal NCR to a sensing node NSEN in response to the sensing on signal SON, a thirteenth transistor T13-1 and T13-2 that transfers the sensing clock signal SCLK to the internal control node NQ in response to a voltage of the sensing node NSEN, and a third capacitor C3 coupled between the line of the low gate voltage VGL and the sensing node NSEN.

According to some example embodiments, as illustrated in FIG. 5, the twelfth transistor T12-1 and T12-2 may be implemented with two transistors T12-1 and T12-2 that are connected in series, and the thirteenth transistor T13-1 and T13-2 may be implemented with two transistors T13-1 and T13-2 that are connected in series. The sensing signal outputting block SENSOB may include a fourteenth transistor T14 that outputs a fourth scan clock signal CLK4 as the sensing signal SENS in response to the voltage of the internal control node NQ, a fifteenth transistor T15 that transfers the low gate voltage VGL to a sensing output node in response to the voltage of the internal inverted control node NQB, and a fourth capacitor C4 coupled between the internal control node NQ and the sensing output node.

In this case, a size of the sensing signal outputting block SENSOB of the second buffer portion BUFP2b may be smaller than a size of the sensing signal outputting block SENSOB of the first buffer portion BUFP1b. To achieve the smaller size of the sensing signal outputting block SENSOB of the second buffer portion BUFP2b, the fourteenth and fifteenth transistors T14 and T15 of the sensing signal outputting block SENSOB of the second buffer portion BUFP2b may have a size (e.g., a channel width) smaller than that of the fourteenth and fifteenth transistors T14 and T15 of the sensing signal outputting block SENSOB of the first buffer portion BUFP1b.

Further, as illustrated in FIG. 3, the sensing signal outputting block SENSOB of the first buffer portion BUFP1 and BUFP1b may be coupled to a corresponding sensing control line SCL, and may output the corresponding sensing signal SENS to the corresponding sensing control line SCL. However, the sensing signal outputting block SENSOB of the second buffer portion BUFP2 and BUFP2b may not be connected to a sensing control line. Accordingly, although the sensing signal outputting block SENSOB of the second portion BUFP2 and BUFP2b includes the fourteenth and fifteenth transistors T14 and T15 having the small size, the dummy stage 141a including the second buffer portion BUFP2 and BUFP2b may operate normally. As described above, the second buffer portion BUFP2 and BUFP2b may have the width W2 narrower than the width W1 of the first buffer portion BUFP1 and BUFP1b, and thus damage to the display panel 110a that may otherwise be caused during an open/short test may be prevented or reduced.

Figure 6:
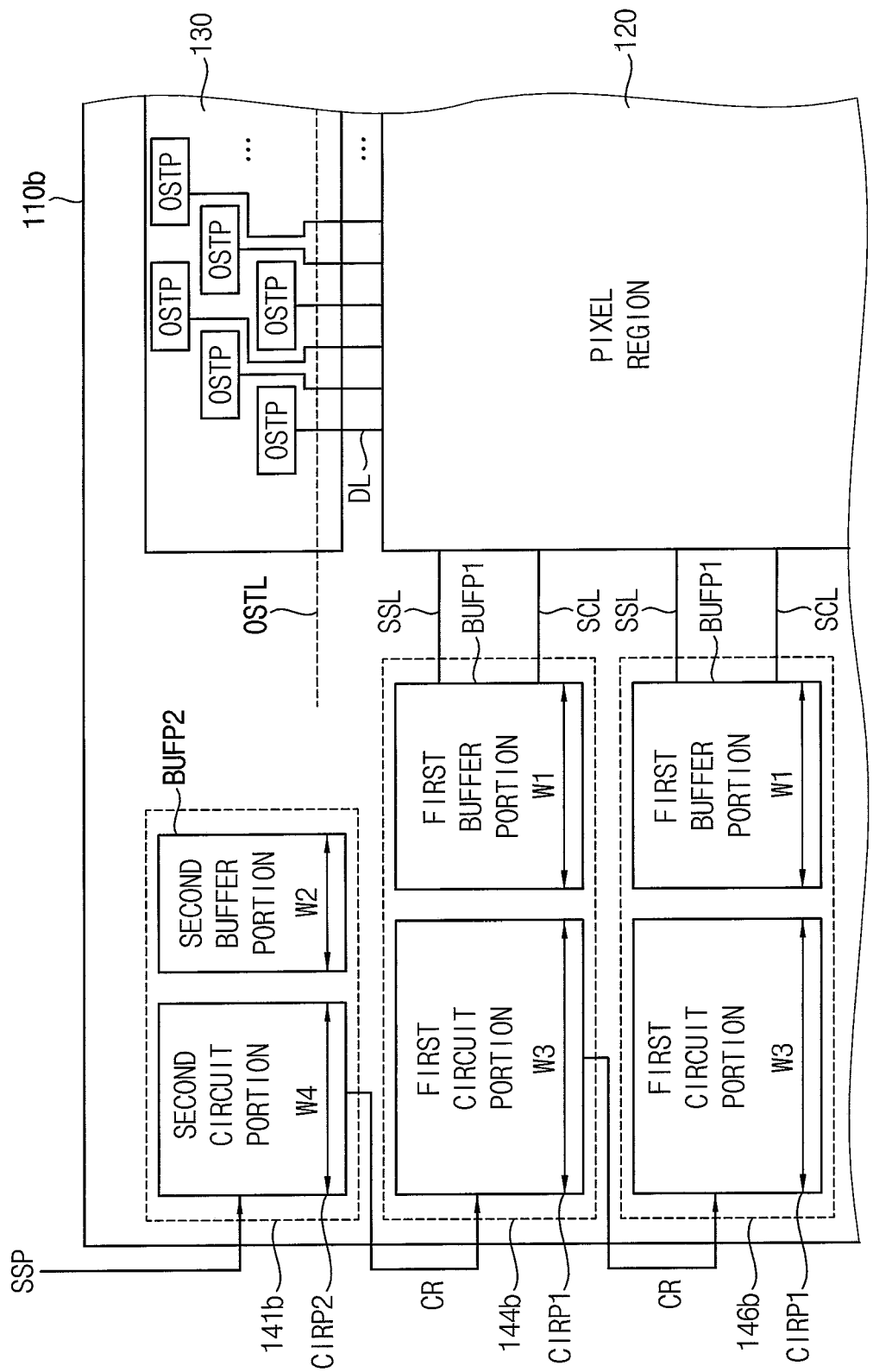
FIG. 6 is a diagram illustrating a portion of a display panel according to some example embodiments.
Figure 7:
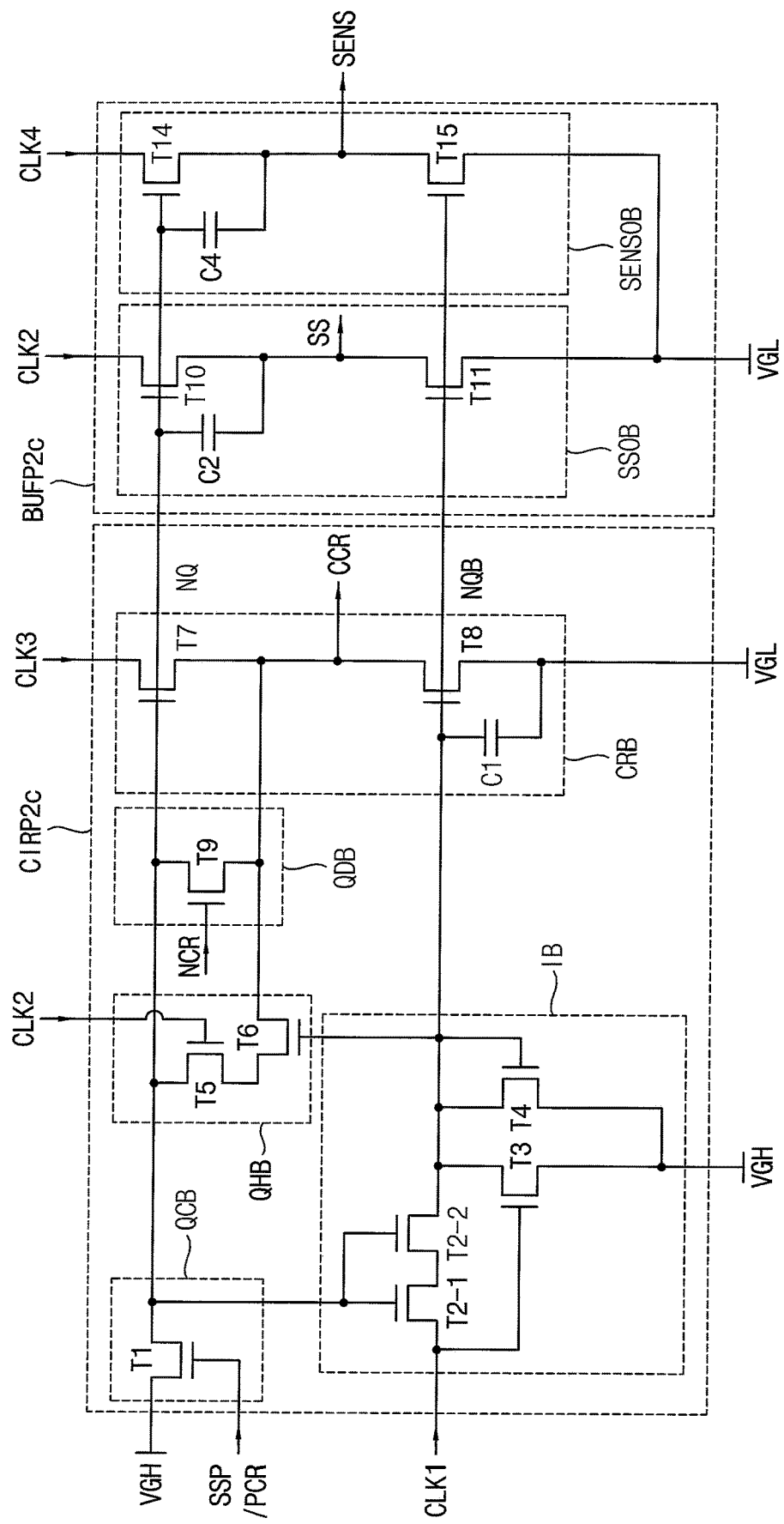
FIG. 7 is a circuit diagram illustrating an example of a dummy stage included in a display panel of FIG. 6.

FIG. 6 is a diagram illustrating a portion of a display panel according to some example embodiments, and FIG. 7 is a circuit diagram illustrating an example of a dummy stage included in a display panel of FIG. 6.

Referring to FIG. 6, a display panel 110b according to some example embodiments may include a pixel region 120 in which a plurality of pixels is formed, an open/short test region 130 in which a plurality of open/short test pads OSTP is formed, at least one dummy stage 141b that generates a carry signal CR in response to a scan start signal SSP, and a plurality of stages 144b and 146b (or normal stages 144b and 146b) that sequentially provides a plurality of scan signals to the plurality of pixels in response to the carry signal CR.

Each stage 144b and 146b may include a first circuit portion CIRP1 that operates in response to a previous carry signal, and a first buffer portion BUFP1 controlled by the first circuit portion CIRP1 to output a corresponding scan signal and a corresponding sensing signal. The dummy stage 141b may include a second circuit portion CIRP2 that operates in response to the scan start signal SSP, and a second buffer portion BUFP2 controlled by the second circuit portion CIRP2. So that the plurality of stages 144b and 146b may be spaced apart by a first distance from the pixel region 120, and the dummy stage 141b may be spaced apart by a second distance greater than the first distance from the open/short test region 130, as illustrated in FIG. 6, a width W4 of the second circuit portion CIRP2 of the dummy stage 141b may be narrower than a width W3 of the first circuit portion CIRP1 of each stage 144b and 146b, and a width W2 of the second buffer portion BUFP2 of the dummy stage 141b may be narrower than a width W1 of the first buffer portion BUFP1 of each stage 144b and 146b.

In some example embodiments, each stage 144b and 146b may be implemented as illustrated in FIG. 5, and the dummy stage 141b may be implemented as illustrated in FIG. 7. Thus, the first circuit portion CIRP1b of each stage 144b and 146b may include a sensing block SENB that controls an internal control node NQ based on a sensing on signal SON and a sensing clock signal SCLK as illustrated in FIG. 5, and the second circuit portion CIRP2c of the dummy stage 141b may not include the sensing block SENB as illustrated in FIG. 7. Accordingly, the width W4 of the second circuit portion CIRP2 and CIRP2c of the dummy stage 141b may be narrower than the width W3 of the first circuit portion CIRP1 and CIRP1b of each stage 144b and 146b. Further, a size (e.g., a channel width) of at least one transistor T10, T11, T14 and T15 included in the second buffer portion BUFP2c of the dummy stage 141b may be smaller than a size of at least one transistor T10, T11, T14 and T15 included in the first buffer portion BUFP1b of each stage 144b and 146b. Accordingly, the width W2 of the second buffer portion BUFP2 and BUFP2c of the dummy stage 141b may be narrower than the width W1 of the first buffer portion BUFP1 and BUFP1b of each stage 144b and 146b.

According to some example embodiments, each stage 144b and 146b may be implemented as illustrated in FIG. 5, and the dummy stage 141b may be implemented as illustrated in FIG. 4. Thus, the first circuit portion CIRP1b of each stage 144b and 146b may include the sensing block SENB as illustrated in FIG. 5, and the second circuit portion CIRP2a of the dummy stage 141b may not include the sensing block SENB as illustrated in FIG. 4. Accordingly, the width W4 of the second circuit portion CIRP2 and CIRP2a of the dummy stage 141b may be narrower than the width W3 of the first circuit portion CIRP1 and CIRP1b of each stage 144b and 146b. Further, the first buffer portion BUFP1b of each stage 144b and 146b may include a sensing signal outputting block SENSOB that generates the corresponding sensing signal SENS in response to a voltage of an internal control node NQ of the first circuit portion CIRP1b as illustrated in FIG. 5, and the second circuit portion BUFP2a of the dummy stage 141b may not include the sensing signal outputting block SENSOB as illustrated in FIG. 4. Accordingly, the width W2 of the second buffer portion BUFP2 and BUFP2a of the dummy stage 141b may be narrower than the width W1 of the first buffer portion BUFP1 and BUFP1b of each stage 144b and 146b.

As described above, in the display panel 110b according to some example embodiments, the width W4 of the second circuit portion CIRP2 of the dummy stage 141b may be narrower than the width W3 of the first circuit portion CIRP1 of each stage 144b and 146b, and the width W2 of the second buffer portion BUFP2 of the dummy stage 141b may be narrower than the width W1 of the first buffer portion BUFP1 of each stage 144b and 146b. Accordingly, damage to the display panel 110b that may otherwise be caused during an open/short test may be prevented or reduced.

Figure 8:
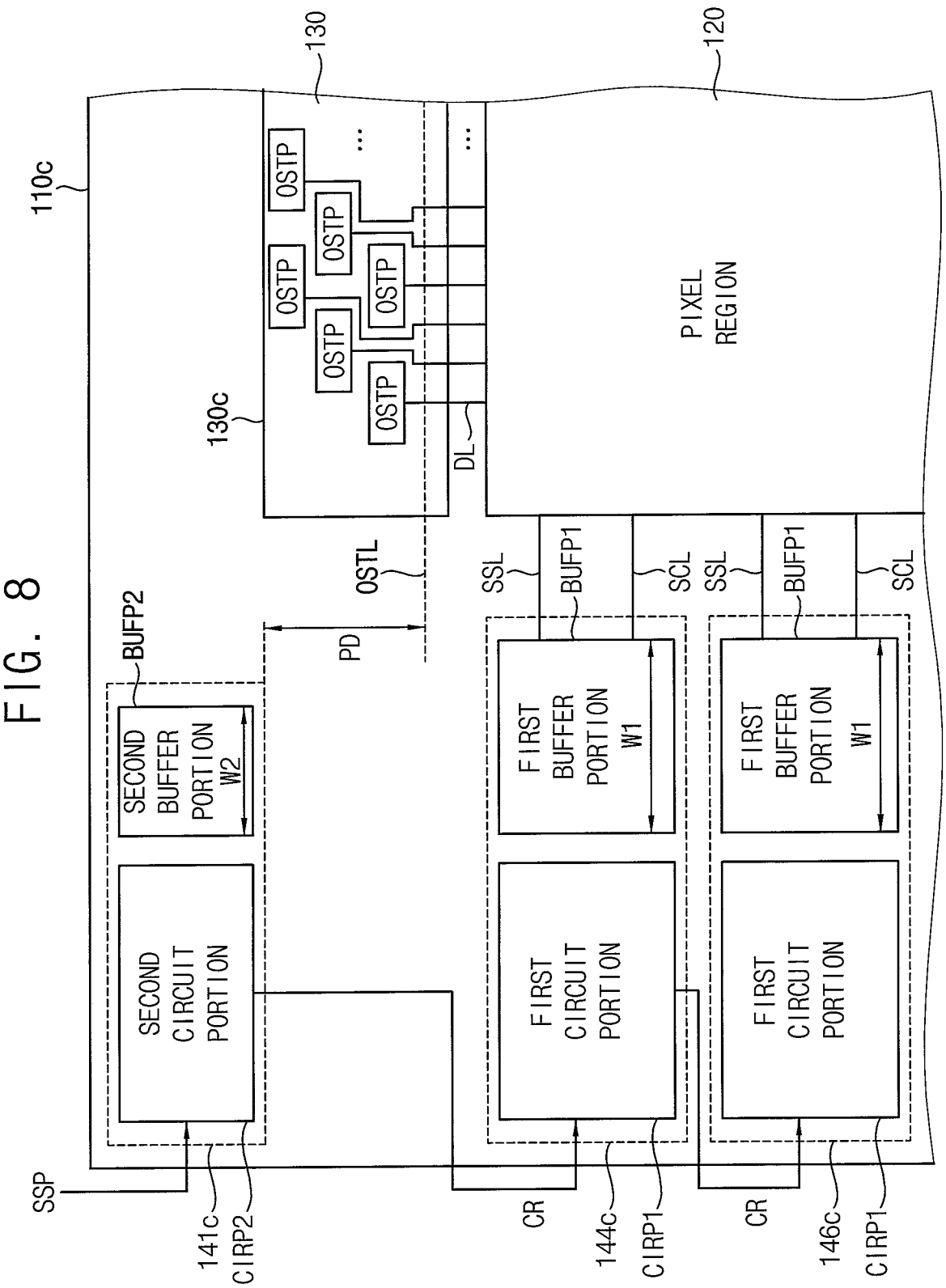
FIG. 8 is a diagram illustrating a portion of a display panel according to some example embodiments.

FIG. 8 is a diagram illustrating a portion of a display panel according to some example embodiments.

Referring to FIG. 8, a display panel 110c according to some example embodiments may include a pixel region 120 in which a plurality of pixels is formed, an open/short test region 130 in which a plurality of open/short test pads OSTP is formed, at least one dummy stage 141c that generates a carry signal CR in response to a scan start signal SSP, and a plurality of stages 144c and 146c that sequentially provides a plurality of scan signals to the plurality of pixels in response to the carry signal CR.

In the display panel 110c, the dummy stage 141c may be spaced apart from an open/short test line OSTL which a probe of an open/short test equipment moves along. In some example embodiments, as illustrated in FIG. 8, the open/short test line OSTL may extend in a horizontal direction (e.g., a direction of a scan line SSL), and the dummy stage 141c may be spaced apart by a predetermined distance PD along a vertical direction (e.g., a direction of a data line DL) from the open/short test line OSTL. In an example, as illustrated in FIG. 8, the dummy stage 141c may be formed outside an outer edge 130c of the open/short test region 130, which is a distal edge 130c of the open/short test region 130 from the pixel region 120. Further, in some example embodiments, a width of the dummy stage 141c may be narrower than a width of each stage 144c and 146c.

As described above, in the display panel 110c according to some example embodiments, the dummy stage 141c may be spaced apart from the open/short test line OSTL which the probe of the open/short test equipment moves along, and thus damage that may otherwise be caused by the probe of the open/short test equipment during an open/short test may be prevented or reduced.

Figure 9:
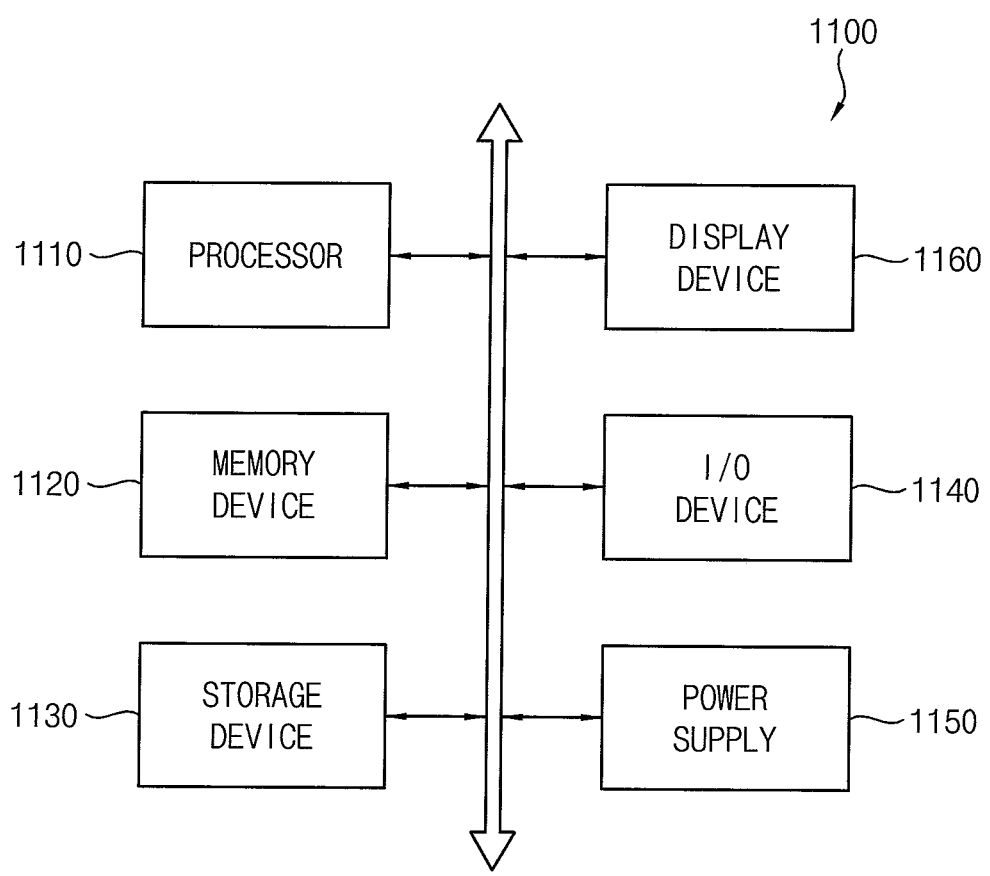
FIG. 9 is a block diagram illustrating an example of an electronic device including a display device according to some example embodiments.

FIG. 9 is a block diagram illustrating an example of an electronic device including a display device according to some example embodiments.

Referring to FIG. 9, an electronic device 1100 may include a processor 1110, a memory device 1120, a storage device 1130, an input/output (I/O) device 1140, a power supply 1150, and an display device 1160. The electronic device 1100 may further include a plurality of ports for communicating a video card, a sound card, a memory card, a universal serial bus (USB) device, other electric devices, etc.

The processor 1110 may perform various computing functions or tasks. The processor 1110 may be an application processor (AP), a micro processor, a central processing unit (CPU), etc. The processor 1110 may be coupled to other components via an address bus, a control bus, a data bus, etc. Further, in some example embodiments, the processor 1110 may be further coupled to an extended bus such as a peripheral component interconnection (PCI) bus.

The memory device 1120 may store data for operations of the electronic device 1100. For example, the memory device 1120 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile dynamic random access memory (mobile DRAM) device, etc.

The storage device 1130 may be a solid state drive (SSD) device, a hard disk drive (HDD) device, a CD-ROM device, etc. The I/O device 1140 may be an input device such as a keyboard, a keypad, a mouse, a touch screen, etc, and an output device such as a printer, a speaker, etc. The power supply 1150 may supply power for operations of the electronic device 1100.

In the display device 1160, a plurality of stages may be spaced apart by a first distance from a pixel region, and a dummy stage may be spaced apart by a second distance greater than the first distance from an open/short test region. Further, in some example embodiments, the second distance between the open/short test region and the dummy stage may be greater than or equal to a reference distance for preventing damage caused by an open/short test equipment. Accordingly, in the display device 1160 according to some example embodiments, damage to a display panel during an open/short test may be prevented or reduced.

According to some example embodiments, the electronic device 1100 may be any electronic device including the display device 1160, such as a cellular phone, a smart phone, a tablet computer, a wearable device, a personal digital assistant (PDA), a portable multimedia player (PMP), a digital camera, a music player, a portable game console, a navigation system, a digital television, a 3D television, a personal computer (PC), a home appliance, a laptop computer, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims and their equivalents.

What is claimed is:

1. A display panel comprising:
   a pixel region comprising a plurality of pixels;
   an open/short test region comprising a plurality of open/short test pads;
   a dummy stage configured to generate a carry signal in response to a scan start signal; and
   a plurality of stages configured to sequentially provide a plurality of scan signals to the plurality of pixels in response to the carry signal,
   wherein the plurality of stages is spaced apart by a first distance from the pixel region, and the dummy stage is spaced apart by a second distance greater than the first distance from the open/short test region.

2. The display panel of claim 1, wherein the second distance between the open/short test region and the dummy stage is greater than or equal to a reference distance.

3. The display panel of claim 1, wherein a width of the dummy stage is narrower than a width of each of the plurality of stages.

4. The display panel of claim 1, wherein each of the plurality of stages includes:
   a first circuit portion configured to operate in response to a previous carry signal; and
   a first buffer portion controlled by the first circuit portion to output a corresponding scan signal of the plurality of scan signals,
   wherein the dummy stage includes:
   a second circuit portion configured to operate in response to the scan start signal; and
   a second buffer portion controlled by the second circuit portion, and
   wherein a width of the second buffer portion of the dummy stage is narrower than a width of the first buffer portion of each of the plurality of stages.

5. The display panel of claim 4, wherein a size of at least one transistor included in the second buffer portion is smaller than a size of at least one transistor included in the first buffer portion.

6. The display panel of claim 4, wherein each of the first circuit portion and the second circuit portion includes:
   a control node charging block configured to charge an internal control node in response to the scan start signal or the previous carry signal;
   an inverter block configured to control an internal inverted control node based on a voltage of the internal control node;
   a control node holding block configured to hold the voltage of the internal control node;
   a carry block configured to generate a current carry signal in response to the voltage of the internal control node; and
   a control node discharging block configured to discharge the internal control node in response to a next carry signal,
   wherein each of the first buffer portion and the second buffer portion includes:
   a scan signal outputting block configured to generate the corresponding scan signal in response to the voltage of the internal control node, and
   wherein a size of the scan signal outputting block of the second buffer portion is smaller than a size of the scan signal outputting block of the first buffer portion.

7. The display panel of claim 6, wherein the scan signal outputting block of the first buffer portion is coupled to a corresponding scan line, and outputs the corresponding scan signal to the corresponding scan line, and
   wherein the scan signal outputting block of the second buffer portion is not coupled to a scan line.

8. The display panel of claim 6, wherein each of the first circuit portion and the second circuit portion further includes:
   a sensing block configured to control the internal control node based on a sensing on signal and a sensing clock signal,
   wherein each of the first buffer portion and the second buffer portion further includes:
   a sensing signal outputting block configured to generate a corresponding sensing signal of a plurality of sensing signals in response to the voltage of the internal control node, and wherein a size of the sensing signal outputting block of the second buffer portion is smaller than a size of the sensing signal outputting block of the first buffer portion.

9. The display panel of claim 8, wherein the sensing signal outputting block of the first buffer portion is coupled to a corresponding sensing control line, and is configured to output the corresponding sensing signal to the corresponding sensing control line, and
   wherein the sensing signal outputting block of the second buffer portion is not coupled to a sensing control line.

10. The display panel of claim 1, wherein each of the plurality of stages includes:
    a first circuit portion configured to operate in response to a previous carry signal; and
    a first buffer portion controlled by the first circuit portion to output a corresponding scan signal of the plurality of scan signals and a corresponding sensing signal of a plurality of sensing signals,
    wherein the dummy stage includes:
    a second circuit portion configured to operate in response to the scan start signal; and
    a second buffer portion configured to be controlled by the second circuit portion,
    wherein a width of the second circuit portion of the dummy stage is narrower than a width of the first circuit portion of each of the plurality of stages, and
    wherein a width of the second buffer portion of the dummy stage is narrower than a width of the first buffer portion of each of the plurality of stages.

11. The display panel of claim 10, wherein the first circuit portion includes a sensing block configured to control an internal control node based on a sensing on signal and a sensing clock signal, and
    wherein the second circuit portion does not include the sensing block.

12. The display panel of claim 10, wherein a size of at least one transistor included in the second buffer portion is smaller than a size of at least one transistor included in the first buffer portion.

13. The display panel of claim 10, wherein the first buffer portion includes a sensing signal outputting block configured to generate the corresponding sensing signal in response to a voltage of an internal control node of the first circuit portion, and
    wherein the second circuit portion does not include the sensing signal outputting block.

14. The display panel of claim 1, further comprising:
    a wiring formed on the dummy stage and the plurality of stages,
    wherein the wiring is spaced apart by a third distance from the pixel region, and is spaced apart by a fourth distance greater than the third distance from the open/short test region.

15. The display panel of claim 14, wherein the wiring includes:
    a first portion passing through the dummy stage and extending in a vertical direction;
    a second portion extending in a horizontal direction between the dummy stage and the plurality of stages; and
    a third portion passing through the plurality of stages and extending in the vertical direction.

16. A display device comprising:
    a display panel including a pixel region comprising a plurality of pixels, an open/short test region comprising a plurality of open/short test pads, a dummy stage configured to generate a carry signal in response to a scan start signal, and a plurality of stages configured to sequentially provide a plurality of scan signals to the plurality of pixels in response to the carry signal;

a data driver configured to output data signals to the display panel; and a controller configured to control the data driver, the dummy stage and the plurality of stages, wherein the plurality of stages is spaced apart by a first distance from the pixel region, and the dummy stage is spaced apart by a second distance greater than the first distance from the open/short test region.

\* \* \* \* \*